United States Patent
Mori et al.

(12)

(10) Patent No.: US 6,407,150 B1
(45) Date of Patent: Jun. 18, 2002

(54) PROCESSES FOR PRODUCING PHENOLIC RESIN AND EPOXY RESIN

(75) Inventors: Satoshi Mori, Yokohama; Fumiaki Oshimi, Atsugi; Masato Hattori, Yokohama, all of (JP)

(73) Assignee: Nippon Petrochemicals Company, Limited, Tokyo (JP)

( * ) Notice: Subject to any disclaimer, the term of this patent is extended or adjusted under 35 U.S.C. 154(b) by 0 days.

(21) Appl. No.: 09/601,975

(22) PCT Filed: Dec. 15, 1999

(86) PCT No.: PCT/JP99/07032

§ 371 (c)(1),
(2), (4) Date: Aug. 10, 2000

(87) PCT Pub. No.: WO00/35988

PCT Pub. Date: Jun. 22, 2000

(30) Foreign Application Priority Data

Dec. 15, 1998 (JP) .............................. 10-375460

(51) Int. Cl.⁷ .............................. C08K 3/10; C08L 63/02
(52) U.S. Cl. .................... 523/457; 528/205; 549/517; 549/518; 549/541; 549/542; 568/721; 568/756; 568/766
(58) Field of Search ................................. 523/463, 457; 528/205; 568/721, 756, 766; 549/517, 518, 541, 542

(56) References Cited

U.S. PATENT DOCUMENTS 5,344,899 A * 9/1994 Enomoto .................... 525/534

FOREIGN PATENT DOCUMENTS

| JP | 4-300916 | 10/1992 |
|----|----------|---------|
| JP | 5-5022 | 1/1993 |
| JP | 7-252349 | 10/1995 |
| JP | 8-53539 | 2/1996 |
| JP | 11-49936 | 2/1999 |
| JP | 11-199657 | 7/1999 |
| JP | 11-199659 | 7/1999 |

OTHER PUBLICATIONS

Handbook of Epoxy Resins, Lee & Neville, pp. 2–4 & 2–5, 1967.*

* cited by examiner

Primary Examiner—Robert Dawson
Assistant Examiner—D. Aylward
(74) Attorney, Agent, or Firm—Hollander Law Firm, P.L.C.

(57) ABSTRACT

A process for producing phenol resin having good color tone, which process comprises reacting hydroxyl group-containing aromatic compound and unsaturated cyclic hydrocarbon under the condition that the moisture is 100 ppm or less and the concentration of Friedel-Crafts catalyst is 0.07 mass % or less in a reaction system and a process for producing epoxy resin having good color tone, which process comprises reacting the obtained phenol resin and epihalohydrin in the presence of base catalyst, removing remaining catalyst and further removing unreacted epihalohydrin.

20 Claims, No Drawings

PROCESSES FOR PRODUCING PHENOLIC RESIN AND EPOXY RESIN

BACKGROUND OF THE INVENTION (1) Field of the Invention

The present invention relates to a process for producing phenol resin and epoxy resin, which are excellent in color tone and which are derived from unsaturated cyclic hydrocarbon such as dicyclopentadiene together with phenol.

More particularly, the invention relates to a process for producing phenol resin and epoxy resin which are excellent in the resistance to heat, moisture and cracking or the like, so that they are useful as electrically insulating materials, particularly as resins for sealing or encapsulating semiconductors and resins for laminated plates. Furthermore, both the resins are excellent in external appearance and in marking property owing to their good color tone or color density (hereinafter sometimes referred to as simply "color").

(2) Prior Art

In recent years, with the rapid progress in scientific technology, especially in electronic industry, requirements for properties of several products and their raw materials becomes gradually severer. Among them, the improvement in semiconductor technology is remarkable. With the progress in complexity of semiconductor memory, electronic circuits become minute and chip sizes become large. Moreover, mounting method is shifted from through-hole mounting to surface mounting. However, in automation lines of surface mounting, several troubles take place. For example, when a lead wires are soldered, semiconductor packages suffer from rapid change of temperature, which causes cracking in molded resin parts for sealing semiconductors, and interfaces among lead wires and resin are damaged to cause deterioration of moisture-proofing property.

In order to prevent the moisture-proofing property from deterioration, a method to increase the amount of filler by changing its particle shape is proposed. However, with this method, elasticity of resin increases, so that the resin is liable to suffer cracking due to thermal shock. Therefore, in order to reduce the thermal shock in semiconductor package when it is immersed in a solder bath, methods of modifying resin composition are proposed, such as the addition of silicone compounds or thermoplastic oligomer into the resin, or modification with silicone. However, in all of these methods, molded products suffer cracking after they are immersed into a solder bath, so that reliable resin compositions for sealing semiconductor cannot still be obtained.

In resin compositions for sealing semiconductor, those used as hardening agents are phenol resins such as phenolic novolak resin and cresol novolak resin, and the one used as a main component is epoxy resin having cresol novolak structure. However, when these resins are used, moisture-proofing property of semiconductor package is impaired to cause inevitably the above-mentioned cracking during immersion in a solder bath.

In recent years, therefore, in order to improve the thermal resistance of resin composition for use in sealing semiconductor, investigations have been conducted for improving phenol resins as raw materials of epoxy resins and their hardening agents. In Japanese Patent Application No. H03-66919, the present inventors proposed a phenol resin obtained by reacting phenol and an unsaturated polycyclic hydrocarbon compound having two or more carbon-carbon double bonds such as dicyclopentadiene, and they reported that the phenol resin can solve the above problem when it is used as a raw material of epoxy resin and its hardening agent.

It is widely known that the phenol resin modified with dicyclopentadiene can be produced with the use of boron trifluoride or boron trifluoride-phenol complex. However, it has been regarded as a problem that the phenol resins produced by this method are colored into dark brown so deeply that the external appearance of molded products are very poor, and the epoxy resin obtained by reacting the above resin with epihalohydrin is similarly colored into dark brown. When the epoxy resin is used as a raw material of sealing resin compositions, characteristics such as moisture-proofing property and thermal resistance can be improved. But on the other hand, there has been a problem in that the marking property of the compositions is so poor that operating efficiency is remarkably lowered in the process for production.

In Japanese Laid-Open Patent Publication No. H08-53539, a producing method with improving colors of epoxy resins is disclosed. However, the colors are still not satisfactory. Furthermore, this method has problems in that it requires freeze-drying in several times and degassing of raw materials, so that the operating process is complicated and it requires much labor, and in addition, the cost for production is high.

Further, in Japanese Laid-Open Patent Publication No. H07-252349, a method is presented for improving colors of resins by dissolving refined resins in a solvent and then contacting them with inorganic porous materials. However, there is a similar problem that the operating process is complicated and requires much labor, and production cost is expensive.

It is, therefore, the primary object of the present invention is to propose a method for producing phenol resin having desirable color tone by reacting hydroxyl group-containing aromatic compound and unsaturated cyclic hydrocarbon in the presence of an acid catalyst. Another object of the invention is to provide a method for producing epoxy resin that is excellent in color tone by using the above phenol resin.

BRIEF SUMMARY OF THE INVENTION

The present inventors have carried out investigation to solve the above problems, as a result, they have found out the following fact in the method for producing phenol resin by reacting hydroxyl group-containing aromatic compound with unsaturated cyclic hydrocarbon in the presence of Friedel-Crafts acid catalyst. That is, phenol resin having good color tone can be obtained by adjusting the moisture content in a reaction system during reaction, and in addition by adjusting the concentration of Friedel-Crafts catalyst. Furthermore, epoxy resin having good color tone can be obtained by adding glycidyl group to the obtained phenol resin in the presence of base catalyst, removing residual catalyst and refining by distilling off unreacted epihalohydrin. As a result, they have accomplished the present invention.

Thus, a first aspect of the present invention is a process for producing a phenol resin having good color tone, which process comprises reacting hydroxyl group-containing aromatic compound and unsaturated cyclic hydrocarbon under the conditions that the moisture is 100 ppm or less and the concentration of Friedel-Crafts catalyst is 0.07 mass % or less in a reaction system.

A second aspect of the present invention is a process for producing a phenol resin described in the first aspect, wherein a hydroxyl group-containing aromatic compound is the one selected from a group consisting of monohydric and dihydric phenols and bisphenol, and an unsaturated cyclic hydrocarbon is dicyclopentadiene.

A third aspect of the present invention is a process for producing a phenol resin described in the first aspect, wherein Friedel-Crafts catalyst is boron trifluoride.

A fourth aspect of the present invention is a process for producing epoxy resin having good color tone, which process comprises reacting the phenol resin described in a first aspect and epihalohydrin in the presence of base catalyst, then removing catalyst residue and removing unreacted epihalohydrin.

The phenol resin obtained in the first aspect of the present invention gives absorbance of 1.0 or lower at wavelength of 350 nm in a dioxane solution of 2 mass %, and the color tone is good.

In other words, it is possible to obtain a phenol resin that gives absorbance of 1.0 or lower at wavelength of 350 nm in a dioxane solution of 2 mass % by the present method. It comprises reacting hydroxyl group-containing aromatic compound and unsaturated cyclic hydrocarbon having two or more carbon-carbon double bonds in the presence of Friedel-Crafts catalyst.

Furthermore, an epoxy resin obtained according to the fourth aspect of the present invention gives absorbance of 0.8 or lower at wavelength of 350 nm in a dioxane solution of 2 mass %, and the color tone is good.

In other words, it is possible to obtain an epoxy resin that gives absorbance of 0.8 or lower at wavelength 350 nm in a solution of 2 mass % in dioxane by the present method. It comprises reacting the phenol resin that is obtained by reaction of hydroxyl group-containing aromatic compound with unsaturated cyclic hydrocarbon having two or more carbon-carbon double bonds in the presence of Friedel-Crafts catalyst, with epihalohydrin in the presence of a base.

DETAILED DESCRIPTION OF THE INVENTION

In the following, the present invention will be described in more detail.

In the present process for producing an epoxy resin having good color tone, phenol resin is produced in the first place as an intermediate material according to the following process.

That is, phenol having phenolic hydroxyl group and unsaturated cyclic hydrocarbon having two or more carbon-carbon double bonds are allowed to react in the presence of Friedel-Crafts catalyst.

Exemplified as unsaturated cyclic hydrocarbons used as raw materials for the phenol resin in the present invention are dicyclopentadiene, 4-vinylcyclohexene, 5-vinylnorborna-2-en, 3a, 4, 7, 7a-tetrahydroindene, α-pinene, and limonene. These compounds can be used in a mixed. Dicyclopentadiene is favorable particularly, because the obtained resin is excellent in thermal resistance, moisture-proofing property and mechanical characteristics.

Commercially available dicyclopentadiene often contains impurities to some extent. However, it can be used without any trouble, as long as its purity is 80 mass % or higher, preferably 90 mass % or higher.

Hydroxyl group-containing aromatic compounds are not particularly limited as long as they have hydroxyl groups directly connected to aromatic rings. Exemplified as favorable ones are monohydric phenols such as phenol, o-cresol, m-cresol, p-cresol, o-ethylphenol, m-ethylphenol, p-ethylphenol, o-propylphenol, m-propylphenol, p-propylphenol, p-sec-butylphenol, p-tert-butylphenol, p-cyclohexylphenol, p-chlorophenol, o-bromophenol, m-bromophenol, p-bromophenol, α-naphthol and β-naphthol; dihydric phenols such as resorcin, catechol, hydroquinone, 2,2-bis(4'-hydroxyphenyl)propane, bis-(hydroxyphenyl)methane, bis(hydroxynaphthyl)methane, tetramethylbiphenol and biphenol; trihydric phenols such as tris(hydroxyphenyl)methane, and the mixtures of them.

Among them, phenol, o-cresol, m-cresol, α-naphthol, β-naphthol and 2,2-bis(4'-hydroxyphenyl)propane are desirable because they are economically efficient and easy to produce. They can also be used as a mixture.

In the reaction of unsaturated cyclic hydrocarbon and hydroxyl group-containing aromatic compound, molecular weight and melt viscosity of the obtained phenol resin can be adjusted arbitrarily by changing the molar ratio of both components. However, the ratio of (hydroxyl group-containing aromatic compound)/(unsaturated cyclic hydrocarbon) in the range of 1 to 20 (in molar ratio) is generally preferable. Particularly when melt viscosity must be lowered, the ratio of (hydroxyl group-containing aromatic compound)/(unsaturated cyclic hydrocarbon) in the range of 1 to 15 (in molar ratio) is preferable.

When epoxidation is carried out by using phenol resin having low melt viscosity, epoxy resin having low melt viscosity is obtained. Both the resins can be filled with large quantities of fillers, so that they have preferably low coefficients of linear expansion and high water resisting property.

When catalyst is used in a small quantity, the molar ratio of (hydroxyl group-containing aromatic compound)/(unsaturated cyclic hydrocarbon) of 7 to is preferable.

As Friedel-Crafts catalysts used for producing the phenol resin in the present invention, those are used, which have good activities and easiness of removing. That is, they are metal halides such as boron trifluoride, their complex catalysts such as boron trifluoride-ether complex, boron trifluoride-phenol complex, boron trifluoride-water complex, boron trifluoride-alcohol complex and boron trifluoride-amine complex, and mixtures of these. Among all these, boron trifluoride, boron trifluoride-phenol complex and boron trifluoride-ether complex are desirable.

By the way, boron trifluoride-phenol complex and the like are commercially available in a form of phenol solution. In the present invention, such a phenol solution can be used. Further, when complex catalysts such as boron trifluoride complex are used, there are two ways available. The one is to use previously prepared catalysts just like the above-mentioned commercial phenol solution of boron trifluoride, and the other is to supply a reaction system with boron trifluoride and ligand separately and form a complex in the system for use in reaction.

In producing phenol resins in the present invention, water content is adjusted previously, then reaction is carried out under the condition comprising a concentration of Friedel-Crafts catalyst of 0.07 mass % or less. Here, "concentration of catalyst" in the present invention means that in a reaction system, and Friedel-Crafts catalyst means that exclusive of ligands which constitute complex. For example, when boron trifluoride-phenol complex is used, concentration of catalyst is represented by the amount of boron trifluoride only. Needless to say, it is catalysts containing ligands that are used in a reaction system.

By the way, in the present invention, a mode of reaction that reactant itself serves as a reaction solvent is preferable, though other reaction solvents can be used. In the latter case, concentration of catalyst means that in a reaction system including the reaction solvent.

As to reaction style, either type of batch and continuous flow can be used. In the batch type, the order and the method of adding reactants are not specially restricted. As mentioned later, the method of adding at least unsaturated cyclic hydrocarbon into a reaction system little by little can be used. For example, into a reaction vessel previously supplied with hydroxyl group-containing aromatic compound and, if necessary, solvent, can be added slowly unsaturated cyclic hydrocarbon. Catalysts may be added slowly just like unsaturated cyclic hydrocarbon, and also the whole amount may be added previously.

When at least one of reactants is added little by little in a batch type reaction as above, concentration of catalyst can increase temporarily at the beginning of reaction depending on the modes of supplying catalyst. In the present invention, it is preferable to keep the concentration of catalyst as low as possible, though the temporary high concentration at the beginning of reaction can be allowed. However, in this case also, it is preferable to keep the catalyst concentration 0.10 mass % or less.

In these cases of the present invention, the "concentration of catalyst" means the concentration of catalyst at the final step of supplying raw materials, that is, the concentration at the point when the supply of the whole reactants and catalysts are completed. Further, concentration of catalyst can also increase in the latter period of reaction, and in this case also, the "concentration of catalyst" means that at the point when the supply of the whole reactants including catalysts are completed.

Resins having good color tone are obtained by carrying out the adjustment as mentioned above.

The lower limit of concentration of catalyst can be lowered so long as no trouble occurs, but usually it is kept 0.001 mass % or more.

Further, in the above range of concentration of catalyst, effect of moisture on color tone is great, therefore it is necessary to keep the concentration of moisture in a reaction system 100 ppm or less. Hydroxyl group-containing aromatic compound such as phenol is liable to absorb moisture owing to its polar groups. Exemplified as a method for dehydration is, for example, formation of azeotropic mixture of hydroxyl group-containing aromatic compound, with aromatic hydrocarbon such as toluene or other organic solvents such as oxygen-containing compounds. However, a reaction system absorbs moisture actually sometimes in a process of dehydration, therefore sufficient care is needed for dehydration. Further, it is necessary to dehydrate unsaturated cyclic hydrocarbon and the like before use by conventional procedure.

During a reaction period, usually gas in a reaction vessel is replaced by an inert gas, therefore it is preferable to use an airtight system. When an open system is used for reaction, reaction can be conducted while an inert gas is supplied to a reactor. As inert gases to be used herein, nitrogen, argon and the like are exemplified.

As above, it is most important to adjust the amount of moisture in a reaction system to 100 ppm or less. The amount of moisture must be confirmed by measuring a sample taken from the system.

In producing phenol resins, when an excess of hydroxyl group-containing aromatic compound is used compared with unsaturated cyclic hydrocarbon, the reaction between them can be carried out without solvent. Solvents can be also used, and they are not specially limited as long as they do not hinder the reaction. As preferable solvents, there are aromatic hydrocarbon compounds such as benzene, toluene and xylene.

The amount of solvent to be used is preferably 20–300 mass parts against 100 mass parts of the hydroxyl group-containing aromatic compound.

Temperature of the reaction is in the range of 20–170° C., preferably 50–150° C. If temperature of reaction exceeds 170° C., decomposition of catalyst or side reaction occurs. If it is lower than 20° C., reaction requires longer time uneconomically. Both cases are not desirable.

Though reaction time is not specially limited, it can be usually selected appropriately from the range of 10 minute to 60 hours.

In a method for producing a phenol resin of the present invention, it is enough only to react hydroxyl group-containing aromatic compound with unsaturated cyclic hydrocarbon under the conditions as above, and definite reaction procedures are not specified. For example, the following method can be used.

That is, hydroxyl group-containing aromatic compound, if necessary, with a prescribed organic solvent, is supplied to a reactor, then heated to form an azeotropic mixture and to remove an organic solvent and moisture. It is confirmed that the amount of water content in the system attains to a prescribed value. For this confirmation, usually the liquid can be taken out of the system and measured. After that, a prescribed amount of Friedel-Crafts catalyst is added in the system, then unsaturated cyclic hydrocarbon is added dropwise. Because it is also necessary to adjust the water content of unsaturated cyclic hydrocarbon, it is preferable to measure the water content previously and carry out dehydration according to conventional procedure.

After phenol resin is produced as mentioned above, deactivation of catalyst is carried out.

Though procedure for deactivation is not specially restricted, it is preferable to use the procedure in which the amount of the remaining ionic impurity, such as boron and fluorine, in a final phenol resin is 100 ppm or less. For this purpose, alkali metal, alkaline earth metal, and their oxides, hydroxide and carbonate, and inorganic bases such as ammonium hydroxide and ammonium gas can be used as deactivating agents. It is, however, preferable to use hydrotalcite, because the treatment is simple and prompt, and moreover, the amount of the remaining ionic impurity after treatment is small.

After acid catalyst is deactivated with or adsorbed by hydrotalcite or the like, the hydrotalcite having acid catalyst adsorbed are filtered off to recover the reaction liquid that does not substantially contain the residue of catalyst. Then, the reaction liquid can be condensed by distillation to obtain a hydrocarbon phenol resin of high purity. In carrying out filtration, operating efficiency can be improved by adding solvents or increasing temperature of the filtration feed.

The color estimation method (JIS K 5400) using Gardner standard solution, which has been known as a color estimation method for resin, is originally a method for estimating colors of liquid such as solution. Accordingly, the results are often inconsistent with colors of actual solid resins. Moreover, because the measurement is based on comparison with the standard color liquid, judgement standards differ according to persons taking measurements to cause variation of the results. On the contrary, with the method using absorptiometry in the region of visible rays and ultraviolet rays, variation of the results is small and correlation between measured values and actual colors is good. Therefore, the latter has been adopted as the color estimation method.

In measurement by absorptiometry, resins are dissolved in arbitrary solvents and diluted solutions are used. As diluting solvents, those that have small absorbency over the whole region of visible rays and ultraviolet rays are preferable. Accordingly, aliphatic saturated hydrocarbon solvent, aliphatic saturated hydrocarbon ether or the like is used. However, dioxane, tetrahydrofuran and the like are especially favorable because of great solubility of resins. Usually, dioxane is desirable. Color is estimated with the absorbance measured at wavelength 350 nm.

The present phenol resin excellent in color has the most remarkable characteristic in the absorbance at wavelength 350 nm. That is, those that have the absorbance of 1.0 or lower in a solution of 2 mass % in dioxane are useful as raw material for producing epoxy resin in the following step.

The phenol resins obtained as above are used as raw material for epoxy resins, and also useful as hardening agent of epoxy resin for electrically insulating materials, particularly materials for sealing semiconductors or materials for laminates. Furthermore, they are excellent in outward appearance and marking property owing to their good color. However, the use is not especially restricted.

In the following, a method for producing epoxy resin excellent in color will be described.

The present epoxy resin having good color can be obtained by reacting the phenol resin excellent in color obtained as above with epihalohydrin in the presence of base catalyst to introduce glycidyl group.

The above reaction of introducing glycidyl group can be carried out by the conventional procedure. Definitely, for instance, the phenol resin is reacted with a glycidyl group-containing agent such as epichlorohydrin or epibromohydrin in the presence of base such as sodium hydroxide or potassium hydroxide, usually at 10 to 150° C., preferably at 30 to 80° C. Then, the reaction product is washed with water and dried to give an epoxy resin.

The amount of glycidyl group-containing agent is preferably 2 to 20 times, particularly 3 to 7 times as much as that of hydroxyl group of the phenol resin in molar equivalent.

During the reaction period, the progress of reaction can be hastened by removing water by azeotropic distillation with the glycidyl group-containing agent under reduced pressure.

When the present hydrocarbon epoxy resin is used in a field of electronic materials, sodium chloride as a by-product must be removed completely in the water-washing step. At this time, after glycidyl group-containing agents are recovered by distillation to concentrate the reaction solution, the concentrated product may be dissolved in a solvent and washed with water. As solvents used here, methyl isobutyl ketone, cyclohexanone, benzene, butyl cellosolve and so forth are preferable. Hydrocarbon epoxy resin is obtained by heating the washed concentrate to enrichment.

The epoxy equivalent (g-resin/gram equivalent-epoxy group) of epoxy resin is usually 200 to 500, preferably 250 to 450. If epoxy equivalent exceeds 500, cross-linking density decreases unfavorably.

The epoxy resins obtained as above are superior to conventional epoxy resins having similar structure in color, outward appearance and marking property. Further, the resins of which absorbance is 0.8 or lower by the above-mentioned measurement are good also in actual color preferably.

Because the epoxy resins are excellent in color, they are useful as epoxy resin composition materials for electrically insulating materials, particularly materials for sealing semiconductors and materials for laminates. However, the use is not restricted only to these, but also useful for powder paint, break shoe and so forth.

In the use of epoxy resins, well-known hardening agents can be used. That is, all the compounds that are commonly used as hardening agents for epoxy resins can be used, and there is no restriction in particular. Definitely exemplified are phenolic novolak resin, o-cresol novolak resin, bisphenol A novolak resin, bisphenol F novolak resin, phenol-dicyclopentadiene polyaddition resin, naphthol novolak resin, dihydroxynaphthalene novolak resin; polyhydric phenols having xylidene as connecting group; phenol-aralkyl resin; aliphatic amines such as diethylenetriamine or triethylenetetramine; aromatic amines such as m-phenylenediamine, diaminodiphenylmethane or diaminodiphenylsulfone; polyamide resin and its modified product; hardening agent comprised of acid anhydride such as maleic anhydride, phthalic anhydride, hexahydrophthalic anhydride or pyromellitic anhydride; potential hardening agent such as dicyandiamide, imidazole, boron trifluoride-amine complex or guanidine derivative, and so forth.

The epoxy resins obtained according to the present invention are useful as material for sealing semiconductors. As hardening agents for this use, the following two compounds are preferable. One is aromatic hydrocarbonformaldehyde resin such as phenol novolak resin, which is excellent in hardening property, molding characteristic, thermal resistance and so forth. The other is phenol-aralkyl resin such as the phenol resin by the present invention, which is excellent in hardening property, molding characteristic, low hygroscopicity and so on.

The amount of these hardening agents to be used is not especially restricted as long as it is enough to harden epoxy resins. However, it is preferable to select the amount so that the number of active hydrogen in hardening agent will be nearly equivalent to the number of epoxy group in the epoxy resin used.

Furthermore, in addition to the hardening agent, hardening accelerator can be used optionally. As the hardening accelerator, any of well-known conventional ones can be used. For example, phosphorus-containing compound, tertiary amine, imidazole, metal salt of organic acid, Lewis acid, amine complex and so forth are used. It is possible to use each of these singly, or to use two or more kinds of them jointly. As materials for sealing semiconductors, triphenylphosphine in phosphorus-containing compounds, DBU in amines, and the like are preferable, because they are excellent in hardening property, thermal resistance, electrical property, moisture-proofing reliability and so forth.

In using the epoxy resin obtained by the present invention, the other epoxy resins can be added together.

Other epoxy resins used here are not especially limited. For instance, bisphenol A glycidyl ether-type epoxy resin, bromophenol novolak-type epoxy resin, tetrabromobisphenol A-type epoxy resin, biphenyl-type epoxy resin, trihydroxyphenylmethane-type epoxy resin, tetrahydroxyphenylethane-type epoxy resin and the like are used. The amount of these epoxy resins is not particularly restricted.

Further, various well-known conventional additives, such as coloring agent, flame retarder, mold releasing agent and coupling agent, can be mixed appropriately as the occasion demands.

In preparing materials for molding from the epoxy resin obtained by the present invention, the method such as the following can be used. That is, epoxy resin, hardening agent, hardening accelerator and other additives are mixed into a fully homogeneous state with a mixer and so forth, then subjected to melting and kneading with a hot forming roll or a kneading machine, and crushed after injecting or cooling. The epoxy resins by the present invention are obtained as mentioned above, and their use is not particularly limited. For example, they are used as materials for sealing semiconductors and materials for substrate of printed wiring, insulating powder paint, materials for mold, materials for resist ink, interlaminar insulating materials of build-up type, glass fiber reinforced plastics, carbon fiber reinforced plastics, materials for paint, materials for adhesives and so forth. Moreover, the present epoxy resin may be combined with acrylate to give epoxy acrylate resin, or may be modified with silicone elastomer or CTBN elastomer to give rubber-modified epoxy resin.

Among these uses, the present materials are extremely useful as those for sealing semiconductors, because they are particularly excellent in solder crack resistance. Further, they are also useful as materials for substrate of printed wiring, which are excellent in color as well as in impregnating property, moisture-proofing property, adhering property and so forth. In the following, the materials for sealing semiconductors will be described in more detail.

For preparing materials for sealing semiconductors, inorganic fillers are compounded as essential component in addition to the epoxy resin and hardening agent.

Materials for sealing semiconductors obtained by the present invention satisfy all of the requirements, which include fluidity during molding in sealing semiconductors, hardening property, molding property, thermal resistance after hardening, and further, solder crack resistance in mounting on a printed substrate, and printing characteristic by a laser marking device.

Inorganic filler used for sealing semiconductors is an essential component, which not only increases the mechanical strength and hardness of cured materials, but also gives low moisture absorption and low coefficients of linear expansion, and moreover, increases solder crack resistance. The amount of inorganic filler is not specially restricted. However, when it is in the range of 80 to 95 mass % in the sealing material, the above characteristics are developed excellently. Particularly when the material is used for sealing semiconductors, the above range is preferable because solder crack resistance is remarkably raised. It deserves special mention that fluidity, molding property and so forth are not spoiled at all in the present invention, even if inorganic fillers are added in 80 mass % or more.

Though the kind of inorganic filler is not particularly limited, crushed silica, bead silica, alumina, talc, clay, glass fiber and so forth can be used. Among these, crushed silica and bead silica are generally used as materials especially for sealing semiconductors, and both fluidity during molding and strength of cured material can be improved in a good balance by using a mixture of crushed silica and bead silica. The mixture of crushed silica and bead silica both having the average diameter of 10 to 30 $\mu$m improves particularly these characteristics.

Further, also in the use as materials for sealing semiconductors, other epoxy resin can be added to the epoxy resin of the present invention as mentioned above. As the other epoxy resin, flame-resistant one such as tetrabromobisphenol A-type epoxy resin and bromophenol epoxy resin like bromophenol novolak-type epoxy resin is particularly desirable.

Besides, as other components to be mixed, various additives can be used. They are as follows: flame resistant materials such as antimony trioxide and hexabromobenzene, coloring agents such as carbon black, iron oxide red and mica, mold releasing agents such as natural wax and synthetic wax, and low stress additives such as silicone oil, synthetic rubber and silicone rubber. Further, the above hardening accelerator can be also used preferably.

If necessary, various known conventional additives can be compounded appropriately, such as other kinds of coloring agent, flame retarder, mold releasing agent or coupling agent.

In preparing materials for molding from the epoxy resin obtained by the present invention, the method such as the following can be used. That is, epoxy resin, hardening agent, hardening accelerator and other additives are mixed into a fully homogeneous state with a mixer and so forth, then subjected to melting and kneading with a hot forming roll or a kneading machine, crushed after cooling and tabletted.

The resin-sealed semiconductor apparatuses fabricated with the material for sealing semiconductor obtained by the present invention can be printed using a laser-marking device, and the printed part develops color excellently. The shape of package of semiconductor apparatus is not especially restricted, and packages of all the shapes such as DIP, SOP, SOJ, QFP, BGA and CSP can be used. Laser marking device is not limited particularly either, and so devices such as YAG laser and carbon dioxide laser are utilized.

BEST MODE FOR CARRYING OUT THE PRESENT INVENTION

In the following, the present invention will be described in more detail referring to examples and comparative examples.

Color of the phenol resins in the examples and comparative examples given below was measured according to the following method.

(1) Absorptiometry in ultraviolet and visible ray regions

A solution of phenol resin of 2 mass % in dioxane (1,4-dioxane) was measured according to the following method.

Analyzer: ultraviolet-visible ray spectrophotometer (type: Ubest-50, made by Jasco Corp.)
  Preparation of sample: Resin was diluted with dioxane of chemically pure grade containing moisture of 0.1 mass % or less to give a solution of the concentration of 2.00±0.01 mass % for use in measurement.
  Measuring cell: made of quartz, optical path length 10 mm×width 4 mm (2) Gardner standard color method Using a solution of phenol resin of 50% in dioxane, Gardner color number was determined as compared to Gardner standard solution (JIS K 5400).

EXAMPLE 1

(Preparation of phenol resin-1)

Phenol and toluene were put into a reaction vessel and heated to 160° C., so that dehydration was carried out through the formation of an azeotropic mixture of water and toluene and at the same time toluene was distilled out. The amount of phenol inside the reaction system after dehydrating was 780 g. With sampling appropriately, moisture of phenol in the system was confirmed to be 100 ppm or less. Then, 1.7 g of boron trifluoride-phenol complex phenol solution containing 30.0 mass % of boron trifluoride, the same hereinafter) was added in the system. After the mixture was homogenized, 115 g of dicyclopentadiene was added dropwise slowly in an hour while the liquid temperature was kept 70° C., and further, stirring was carried out for 20 hours at the same temperature. In the reaction, the concentration of boron trifluoride in the total amount of phenol, dicyclopentadiene and boron trifluoride was 0.057 mass %.

The moistures of dicyclopentadiene and others were measured separately and confirmed to be 100 ppm or less. Further, the amount of moisture in the reaction system was measured appropriately, and was confirmed to be 100 ppm or less.

After the reaction was over, the temperature was reduced to 70° C. with cooling, and 5.5 g of magnesium hydroxide-aluminum hydroxide (hydrotalcite, trade name: Kyowaad 1000, made by Kyowa Chemical Industry Co., Ltd.) was added to deactivate catalysts, then the reaction liquid was filtered. The obtained filtrate was concentrated by vacuum distillation to obtain 250 g of phenol resin.

The softening point of the obtained phenol resin was 89.0° C., and the phenolic hydroxyl equivalent (g-resin/gram equivalent-hydroxyl group) was 169. As the result of measuring the absorbance of a 2% dioxane solution of the resin, the absorbance at wavelength 350 nm was 0.841, and the Gardner color number was 13 to 14. The results are shown in Table 1.

EXAMPLE 2
(Production of epoxy resin-1)

In a four neck flask of 3 liter equipped with stirrer, refluxing cooler and thermometer were put 169 g of the phenol resin produced according to the procedure described in Example 1 and 400 g of epichlorohydrin, then they were dissolved and stirred. The reaction system was adjusted to pressure of 150 mmHg (200 hPa) and heated up to 68° C. Into this system was added continuously 100 g of an aqueous solution of sodium hydroxide having the concentration of 48 mass %, while a reaction was carried out for 3.5 hours. The water produced by reaction and that contained in the aqueous solution of sodium hydroxide were decomposed by refluxing the azeotropic mixture of water-epichlorohydrin and removed from the reaction system. After the end of reaction, the pressure of the reaction system was set back to atmospheric pressure, and the temperature was increased to 110° C. to remove water completely. Excess epichlorohydrin was distilled out under atmospheric pressure, and further, distillation was carried out under the reduced pressure of 15 mmHg (20 hPa) at 140° C.

To the obtained mixture of resin and sodium chloride were added 300 g of methyl isobutyl ketone and 36 g of an aqueous solution of sodium hydroxide of 10 mass %, and a reaction was carried out for 1.5 hours at 85° C. After the reaction was over, 750 g of methyl isobutyl ketone and 300 g of water were added, then the lower layer of aqueous solution of sodium chloride was removed by separation. Next, the layer of methyl isobutyl ketone was washed with 150 g of water and neutralized with phosphoric acid, and the water layer was removed. Further, 800 g of water was added for washing, and the water layer was removed. The separation of oil layer and water layer was satisfactory, and inorganic salts were recovered quantitatively. Then, the layer of methyl isobutyl ketone was distilled under atmospheric pressure, and vacuum distillation was carried out successively under the pressure of 5 mmHg (6.7 hPa) at 140° C. to obtain 220 g of epoxy resin.

The epoxy equivalent of the above epoxy resin was 261. The content of monofunctional compounds measured with a liquid chromatography was 0.1 mass % or less.

Further, as the result of measuring the absorbance of a 2% dioxane solution of the resin, the absorbance at wavelength 350 nm was 0.690, and the Gardner color number was 11 to 12. The results are shown in Table 1.

EXAMPLE 3
(Preparation of phenol resin-2)

Phenol and toluene were put into a reaction vessel, and azeotropic dehydration was carried out in the manner similar to that of Example 1. The amount of phenol after dehydration was 870 g. Then, 2.25 g of boron trifluoride-phenol complex was added, and 150 g of dicyclopentadiene was added dropwise, further, procedures similar to those of Example 1 were carried out. In the reaction, the concentration of boron trifluoride in the total amount of phenol, dicyclopentadiene and boron trifluoride was 0.066 mass %.

As a result, 330 g of phenol resin was obtained. The moistures of dicyclopentadiene and others were measured separately and confirmed to be 100 ppm or less. Further, the amount of moisture in the reaction system was measured appropriately, and was confirmed to be 100 ppm or less.

The softening point of the obtained phenol resin was 92.5° C., and the hydroxyl equivalent was found to be 170 as the result of measurement. As the result of measuring the absorbance at wavelength 350 nm of a 2% dioxane solution of the resin, it was 0.984, and the Gardner color number was 14 to 15. The results are shown in Table 1.

EXAMPLE 4
(Production of epoxy resin-2)

Procedures similar to those of Example 2 were conducted except that 170 g of the phenol resin synthesized in Example 3 was used, and 180 g of epoxy resin was obtained. The epoxy equivalent of the epoxy resin was 261. The content of monofunctional compounds measured with a liquid chromatography was 0.1 mass % or less.

Further, as the result of measuring the absorbance of a 2% dioxane solution of the resin, the absorbance at wavelength 350 nm was 0.734, and the Gardner color number was 12 to 13. The results are shown in Table 1.

COMPARATIVE EXAMPLE 1
(Preparation of phenol resin-3)

Phenol and toluene were put into a reaction vessel, and azeotropic dehydration was carried out in the manner similar to that of Example 1. The amount of phenol after dehydration was 760 g. Then, 6.6 g of boron trifluoride-phenol complex was added, then 135 g of dicyclopentadiene was added dropwise, and procedures similar to those of Example 1 were carried out. As a result, 290 g of phenol resin was obtained. In the reaction, the concentration of boron trifluoride in the total amount of phenol, dicyclopentadiene and boron trifluoride was 0.220 mass %.

The softening point of the obtained phenol resin was 90.0° C., and the hydroxyl equivalent was 168. As the result of measuring the absorbance of a 2% in dioxane solution of the resin, the absorbance at wavelength 350 nm was 1.642, and the Gardner color number was 18 or higher. The results are shown in Table 1.

COMPARATIVE EXAMPLE 2
(Production of epoxy resin-3)

Procedures similar to those of Examples were conducted except that 168 g of the phenol resin synthesized in Comparative Example 1 was used, and 218 g of epoxy resin was obtained. The epoxy equivalent of the obtained epoxy resin was 266. As the result of measuring the absorbance of a 2% dioxane solution of the resin, the absorbance at wavelength 350 nm was 1.437, and the Gardner color number was 17 to 18. The results are shown in Table 1.

COMPARATIVE EXAMPLE 3
(Preparation of phenol resin-4)

Phenol and toluene were put into a reaction vessel and heated to 160° C. As a result, dehydration was carried out through the formation of an azeotropic mixture of water and toluene, until the content of moisture in the reaction system attained 100 ppm or less, and at the same time toluene was distilled out. Then, the reaction system was subjected to freeze-drying six times for degassing under the pressure of 20 mmHg (27 hPa). The amount of phenol resin after degassing was 320 g.

Then, 2.7 g of boron trifluoride-phenol complex was added in the system. After the mixture was homogenized, 45 g of dicyclopentadiene degassed in the manner similar to that of degassing phenol was added dropwise slowly in an hour while the liquid temperature was kept 60° C., and further, the reaction liquid was heated to 80° C. and stirred for 20 hours. In the reaction, the concentration of boron trifluoride in the total amount of phenol, dicyclopentadiene and boron trifluoride was 0.220 mass %.

After the reaction was over, the temperature was reduced to 70° C. with cooling, and 5.5 g of magnesium hydroxide-aluminum hydroxide (hydrotalcite, trade name: Kyowaad 1000) was added with stirring in an hour at 70° C. to deactivate catalysts, then the reaction liquid was filtered. The obtained filtrate was concentrated by vacuum distillation to obtain 260 g of phenol resin.

The softening point of the obtained phenol resin was 93.0° C., and the phenolic hydroxyl equivalent was 169. As the result of measuring the absorbance of a 2% dioxane solution of the resin, the absorbance at wavelength 350 nm was 1.232, and the Gardner color number was 14 to 15. The results are shown in Table 1.

COMPARATIVE EXAMPLE 4
(Production of epoxy resin-4)

Procedures similar to those of Examples were conducted except that 169 g of the phenol resin synthesized in Comparative Example 3 was used, and 218 g of epoxy resin was obtained. The epoxy equivalent of the obtained epoxy resin was 266.

As the result of measuring the absorbance of a 2% dioxane solution of the resin, the absorbance at wavelength 350 nm was 1.097, and the Gardner color number was 13 to 14. The results are shown in Table 1.

TABLE 1

Color Characteristics of Resin

|  |  | Catalyst Conc. (mass %) | Absorbance at 350 nm | Gardner Color No. |
|---|---|---|---|---|
| Phenol Resin | Ex. 1 | 0.057 | 0.841 | 13–14 |
|  | Ex. 3 | 0.066 | 0.984 | 14 |
|  | Comp. Ex. 1 | 0.220 | 1.642 | 18 or higher |
|  | Comp. Ex. 3 | 0.220 | 1.232 | 14–15 |
| Epoxy Resin | Ex. 2 | — | 0.690 | 11–12 |
|  | Ex. 4 | — | 0.734 | 12–13 |
|  | Comp. Ex. 2 | — | 1.437 | 17–18 |
|  | Comp. Ex. 4 | — | 1.097 | 13–14 |

According to the method of the present invention, it is possible to obtain a phenol resin excellent in color of solid state by restricting both the content of moisture and the amount of catalyst to lower values. In other words, according to the present invention, it is possible to obtain a phenol resin having the absorbance at wavelength 350 nm of 2% dioxane solution of 1.0 or lower, by reacting hydroxyl group-containing aromatic compound and unsaturated cyclic hydrocarbon in the presence of acid catalyst. The resin has an excellent color in addition to moisture-proofing property, thermal resistance, and crack resistance of current resins. Therefore, the molded products are also excellent in outward appearance and marking property.

Furthermore, the epoxy resin, which is obtained by adding glycidyl group to the phenol resin obtained by the above method, gives the absorption of 0.8 or lower under the above conditions, and is excellent in moisture-proofing property and electrical property. Therefore, the cured material obtained by use of the resin is also excellent in moisture-proofing property, and so it is useful as resins for sealing semiconductor, laminates for substrate of printed wiring, powder paint, break shoe and so forth. Further, it is also excellent in outward appearance after molding and marking property because of its excellence in color.

What is claimed is:

1. A process for producing a phenol resin having a good color tone, which process comprises reacting a hydroxyl group-containing aromatic compound and an unsaturated cyclic hydrocarbon under the conditions that the moisture is 100 ppm or less and the concentration of a Friedel-Crafts catalyst is 0.07 by mass % or less in a reaction system, wherein said unsaturated cyclic hydrocarbon is selected from the group consisting of dicyclopentadiene, 4-vinyl-cyclohexene, 5-vinylnorborna-2-ene, α-pinene, limonene and mixtures thereof.

2. A process for producing a phenol resin having a good color tone, which process comprises reacting a hydroxyl group-containing aromatic compound and an unsaturated cyclic hydrocarbon under the conditions that the moisture is 100 ppm or less and the concentration of a Friedel-Crafts catalyst is 0.07 by mass % or less in a reaction system, wherein said hydroxyl group-containing aromatic compound is at least one member selected from the group consisting of monohydric phenols, dihydric phenols and bisphenols, and said unsaturated cyclic hydrocarbon is dicyclopentadiene.

3. A process for producing a phenol resin as claimed in claim 1, wherein said Friedel-Crafts catalyst is a boron trifluoride catalyst.

4. A process for producing an epoxy resin having a good color tone, which process comprises the steps of reacting said phenol resin of claim 1 and epihalohydrin in the presence of a base catalyst, then removing residual catalyst and further removing unreacted epihalohydrin.

5. A process for producing a phenol resin as claimed in claim 2, wherein said Friedel-Crafts catalyst is a boron trifluoride catalyst.

6. A process for producing an epoxy resin having a good color tone, which process comprises the steps of reacting said phenol resin of claim 2 and epihalohydrin in the presence of a base catalyst, then removing residual catalyst and further removing unreacted epihalohydrin.

7. A process for producing a phenol resin having a good color tone, which process comprises reacting a hydroxyl group-containing aromatic compound and an unsaturated cyclic hydrocarbon under the conditions that the moisture is 100 ppm or less and the concentration of a Friedel-Crafts catalyst is 0.07 by mass % or less in a reaction system, wherein said hydroxyl group-containing aromatic compound is at least one member selected from the group consisting of dihydric phenols and bisphenols.

8. A process for producing a phenol resin as claimed in claim 1, wherein said phenol resin has an absorbance of 1.0 or lower at a wavelength of 350 nm in a dioxane solution containing said resin in an amount of 2% by mass.

9. A process for producing an epoxy resin as claimed in claim 4, wherein said epoxy resin has an absorbance of 0.8 or lower at a wavelength of 350 nm in a dioxane solution containing said resin in an amount of 2% by mass.

10. A process for producing a phenol resin as claimed in claim 2, wherein said phenol resin has an absorbance of 1.0 or lower at a wavelength of 350 nm in a dioxane solution containing said resin in an amount of 2% by mass.

11. A process for producing an epoxy resin as claimed in claim 6, wherein the said epoxy resin gives an absorbance of 0.8 or lower at a wavelength of 350 nm in a dioxane solution containing the said resin in an amount of 2% by mass.

12. A process for producing a phenol resin as claimed in claim 7, wherein said Friedel-Crafts catalyst is a boron trifluoride catalyst.

13. A process for producing an epoxy resin having a good color tone, which process comprises the steps of reacting said phenol resin of claim 7 and epihalohydrin in the presence of a base catalyst, then removing residual catalyst and further removing unreacted epihalohydrin.

14. A process for producing a phenol resin as claimed in claim 7, wherein said phenol resin has an absorbance of 1.0 or lower at a wavelength of 350 nm in a dioxane solution containing the said resin in an amount of 2% by mass.

15. A process for producing an epoxy resin as claimed in claim 13, wherein said epoxy resin has an absorbance of 0.8 or lower at a wavelength of 350 nm in a dioxane solution containing the said resin in an amount of 2% by mass.

16. A process for producing phenol resin as claimed in claim 1, wherein said unsaturated cyclic hydrocarbon is dicyclopentadiene.

17. A process for producing phenol resin as claimed in claim 1, wherein said hydroxyl group-containing compound is at least one member selected from the group consisting of dihydric phenols and bisphenols.

18. A process for producing an epoxy resin as claimed in claim 4 where said unsaturated cyclic hydrocarbon is dicyclopentadiene.

19. A process for producing an epoxy resin as claimed in claim 4, wherein said hydroxyl group-containing compound is at least one member selected from the group consisting of dihydric phenols and bisphenols.

20. A process for producing an epoxy resin having a good color tone, which process comprises reacting a phenol resin and epihalohydrin in the presence of a base catalyst, then removing residual catalyst and further removing unreacted epihalohydrin, wherein said phenol resin has an absorbance of 1.0 or lower at a wavelength of 350 nm in a dioxane solution containing the phenol resin in an amount of 2% by mass, and said phenol resin is obtained by reacting a hydroxyl group-containing aromatic compound and an unsaturated cyclic hydrocarbon under the conditions that the moisture is 100 ppm or less and the concentration of a Friedel-Crafts catalyst is 0.07 by mass % or less in a reaction system.

* * * * *